United States Patent [19]
Primeaux

[11] Patent Number: 5,331,205
[45] Date of Patent: Jul. 19, 1994

[54] MOLDED PLASTIC PACKAGE WITH WIRE PROTECTION

[75] Inventor: William F. Primeaux, Austin, Tex.

[73] Assignee: Motorola, Inc., Schaumburg, Ill.

[21] Appl. No.: 838,657

[22] Filed: Feb. 21, 1992

[51] Int. Cl.$^5$ .......................................... H01L 23/28
[52] U.S. Cl. ................................ 257/790; 257/791; 257/793
[58] Field of Search ............... 257/790, 791, 793, 667

[56] References Cited

U.S. PATENT DOCUMENTS

| | | | |
|---|---|---|---|
| H73 | 6/1986 | Claasen et al. | 357/72 |
| 4,523,371 | 6/1985 | Wakashima | 29/588 |
| 4,707,725 | 11/1987 | Ito | 357/72 |
| 4,758,875 | 7/1988 | Fujisaki et al. | 257/790 |
| 4,768,081 | 8/1988 | Moeller | 257/790 |
| 4,788,583 | 11/1988 | Kawahara et al. | 257/790 |
| 4,849,803 | 7/1989 | Yamamoto et al. | 357/790 |
| 4,974,057 | 11/1990 | Tazima | 257/790 |
| 5,206,794 | 4/1993 | Long | 257/675 |

Primary Examiner—William Mintel
Assistant Examiner—Roy Potter
Attorney, Agent, or Firm—Minh-Hien N. Clark

[57] ABSTRACT

A wire bonded semiconductor die in a plastic package having minimal or no wire sweep is provided in which the semiconductor device comprises two different encapsulants. The semiconductor die and the wires including the bonds are completely enveloped by a first encapsulating compound, such as an epoxy resin molding compound like Nitto Denko EP-6045. This first encapsulant serves to protect and lock the wires in an upright position so that no wire sweep occurs during the second encapsulation in which the package body is molded. A second encapsulating molding compound forms the package body through standard transfer molding technique with no modification to existing equipment.

11 Claims, 2 Drawing Sheets

MOLDED PLASTIC PACKAGE WITH WIRE PROTECTION

FIELD OF THE INVENTION

The present invention relates to semiconductor devices in general, and more specifically to the encapsulation of such devices using two different materials.

BACKGROUND OF THE INVENTION

Fine conductive wires are used in the packaging of semiconductor devices to electrically couple a semiconductor die to a leadframe or a substrate. Normally, a connection is made between the die and the leadframe by ball-bonding the conductive wire to a bonding pad on the die, drawing the wire to a lead, and wedge-bonding onto the lead. These wires are generally on the order of 0.0254 mm to 0.0330 mm in diameter. Because of their fineness, wire sweep has been a constant problem in the plastic encapsulation of a semiconductor die. The high viscosity of the molding compound in its liquid state during the transfer molding process has the propensity to drag the wires along the flow path of the compound causing the wires to bend away from their original upright positions. Wire sweep is undesired because it poses a reliability risk to the functionality of the semiconductor device. Wires that are swept may come in contact with each other to cause shorting in the device. Wires may also be sufficiently swept so that the length of the wires touch the surface of the semiconductor die which would cause shortings between different components on the die. Therefore, it is always desirable to keep the wire sweep level to a minimum to protect the functional integrity of the semiconductor device. Ideally, the wires would remain rigidly fixed in place during the molding process, but this condition has not been possible prior to the present invention.

Plastic encapsulation of semiconductor dice has traditionally been accomplished through transfer molding. In the transfer molding process, the epoxy resin based compound is in the form of a solid pellet, which is then placed inside a pot in the mold die. The mold has been preheated to a set molding temperature. Molding is accomplished by a hot plunger coming into contact with the compound pellet. As heat is conducted through the pellet, the material plasticates and begins to flow. The viscosity of the plasticated compound is dependent on basic chemistry of the compound, the amount of filler present in the compound, and the temperature of the mold; that is, the higher the temperature, the lower the viscosity. However, molding compound only remains in a liquid state for a short period of time once it has been plasticated. Moreover, the viscosity will begin to increase again at a faster rate at higher temperatures than at lower temperatures. In effect, molding compound viscosity drops to a lower absolute value at higher temperatures, but stays there for a shorter period of time so that using higher molding temperatures results in having less time to perform the molding process. Because an epoxy resin based molding compound is a thermoset, it cannot be remelted and reshaped once the compound has gelled or hardened. Therefore, transfer molding must be completed before the compound gels. Thus, the time allowed to complete the transfer of compound into the mold die cavities is strictly limited to the time that the mold compound viscosity is such that flow is not hindered. It should be clear that the more viscous the compound is during the transfer process, the more drag it induces on objects, namely the wires, in its flow path. It is, therefore, tempting to transfer the compound as quickly as possible in molding. However, the disadvantage to using very fast transfer speeds is that the probability of inducing wire sweep increases with increasing transfer speed. The alternative is to use a lower molding temperature which delays the gel time of the compound thereby allowing a slower transfer speed to be used to help limit the amount of wire sweep. However, a slow transfer speed translates into a long molding cycle time which would affect production cycle time. Moreover, a slow transfer speed by itself is not sufficient to eliminate wire sweep. There are other important underlying factors, such as the viscosity of the particular molding compound, the length of the wires, the position of the wires relative to the flow path of the material.

Because of all of the above mentioned factors, wire sweep has always been unavoidable during molding, but controlling it is an established challenge in the production of semiconductor devices. Certain factors contribute to the overall difficulty in limiting the wire sweep. As stated previously, flowing molding compound exerts a drag force on the wires. If this force exceeds the strength of the wires or of the bonds, then the wires will bend in the direction of the force. Longer wires tend to sweep more easily than shorter wires; therefore, it is desirable to keep the wire lengths as short as possible. However, it is not always possible to keep the wire lengths short. Other constraints in the packaging technology are pushing the wires to longer lengths. It is often necessary to place a small die onto a large die pad or flag; that is, there is more than 0.64 mm clearance, a typical maximum constraint for this dimension, from an edge of the die to the corresponding edge of the flag. Having a die on a flag that exceeds the typical maximum allowable clearance often forces the connecting wires to be longer than desired. There is also a greater risk of sagging wires which would cause shorting in the device if the wires touch the metal flag. Furthermore, some packages are becoming larger in size in addition to having more pin counts. The QFP's (Quad Flat Packages) range in size from 7 mm×7 mm to 40 mm×40 mm. Larger package sizes generally correlate to longer wire lengths because some of the semiconductor dice that are placed within these high lead count packages are much smaller than the smallest flag size that can be designed into the leadframe.

Another factor that contributes to the difficulty of controlling wire sweep is the proximity of the wires to each other. The closer the wires are together, the more critical it becomes to limit the wire sweep to reduce the possibility of wires coming into contact with each other. Miniaturization of the geometry of circuit patterns on a semiconductor die is resulting in bonding pads being designed closer together. Moreover, die designers are putting more components on a single die to expand its functions. Increased functionality of each chip results in more I/O's. More output pads and smaller die circuit geometry combine to make the packaging process more difficult because the wires get longer and also placed closer together, both on the semiconductor die and on the leadframe. Increased pin counts forces the lead tips on the leadframe to be designed closer together. Some of the QFP's are already in production at 0.4 mm pitch between the leads and some are progressing toward 0.3 mm pitch and smaller.

An additional development in the packaging field that will contribute to the wire sweep problem is the emergence of fine pitched QFP (quad flat package) in molded carrier rings (MCR). The MCR poses a manufacturing problem because the molding process is more complicated than molding non-MCR packages. The MCR and the package can be filled sequentially with the MCR usually being filled first, or they can also be filled at the same time using a different gating configuration. The process window for this operation is very restrictive because the molding compound must be transferred quickly enough to fill both the MCR and the package before the compounds gels but it must also be transferred slowly enough not to cause excessive wire sweep. Because of the tight process window with this type of package, production yield can be affected since any deviation outside the established process window can cause molding rejects due to excessive wire sweep or incomplete filling of the part.

Several categories of transfer molds are currently in use for the plastic encapsulation of semiconductor dice. Mold tools can be of the conventional type, plate type, or automatic type. Conventional molds and plate molds utilize a single large pellet of molding compound to encapsulate multiple packages. A long runner system is required to accomplish this task. The mold die cavities are sequentially filled from the closest mold cavity to the pot and then continuing to fill subsequent cavities further away from the pot. Disadvantages in molding using these kinds of molds are long cycle times and insufficient process controls to limit the amount of wire sweep.

The emergence of the automatic multi-plunger molding system has mitigated the wire sweep problem. In this type of mold, the runners are kept very short, and each mold die cavity is usually fed by an individual pellet of molding compound. This scheme shortens the distance that the compound must flow which offers several advantages. Since the compound has a much shorter path of travel, most of the transfer can be completed while the compound is at its lowest viscosity state. Reduction in molding cycle time has also been achieved through the use of automatic multi-plunger molds. However, having automatic molds is not sufficient to eliminate wire sweep. For some of the older packages, such as the PDIP (Plastic Dual In-line Package) where the wires are short and the pitch between the leads is 2.54 mm, the use of automolding equipment is adequate in controlling wire sweep. However, it is still very difficult to control the wire sweep in the high pin count, fine pitch packages. Manufacturing productivity decreases because more molding related rejects are found with these newer packages because the automatic related rejects are found with these newer packages because the automatic molding systems cannot keep the wires rigidly fixed in place during the transfer of molding compound. Thus, new trends in die design and packaging pose a greater challenge to the wire sweep problem than the automold can solve.

SUMMARY OF THE INVENTION

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated. In accordance with the invention, there is provided a semiconductor device having a leadframe, a semiconductor die, a conductive wire, a first encapsulating compound, and a second encapsulating compound. The leadframe has a die receiving area and a plurality of leads. The semiconductor die has a plurality of bonding pads and is attached to the die receiving area. The conductive wire extends from each of the bonding pads to one of the plurality of leads and electrically couples the semiconductor die to the leadframe. The first encapsulating compound, a material having a low coefficient of thermal expansion, is formed over the surface of the die including the pads and completely encapsulates each of the conductive wires. The second encapsulating compound surrounds the die, the first encapsulating compound, and a portion of the leads.

DETAILED DESCRIPTION OF A PREFERRED EMBODIMENT

Figure 1:
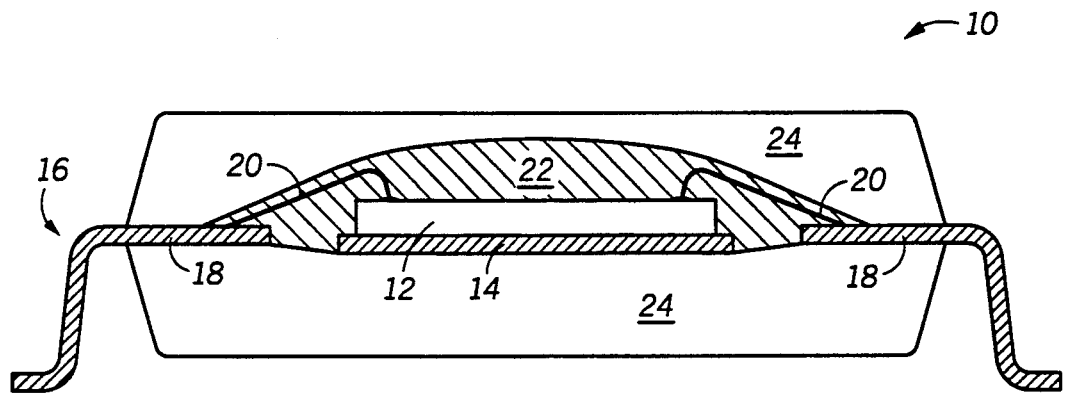
FIG. 1 is a cross-sectional view of a finished semiconductor device, in accordance with the present invention.

With the present invention, it is possible to meet the previously stated desired feature of minimal wire sweep in a molded semiconductor device. The invention enables a wire-bonded leadframe to be molded without affecting the position of the wires and their bonds. Moreover, this invention provides a method for manufacturing such a device. A finished semiconductor device 10, in accordance with the invention, is illustrated in FIG. 1. A semiconductor die 12 is attached to a mounting surface 14 of a leadframe 16, typically by use of a conductive adhesive material such as a conductive filled epoxy. Leadframe 16 is also made of a conductive material such as copper, a copper alloy, an iron-nickel alloy, or other metals. Leadframe 16 has a plurality of leads 18 which each have ends proximal and distal to semiconductor die 12. The leads are electrically coupled to the die. As illustrated, wire bonds 20 are used to couple proximal ends of leads 18 to bonding pads (not shown) on semiconductor die 12. Wire bonds 20 are of a conductive material such as gold, copper, aluminum, or alloys of these materials.

As illustrated in FIG. 1, the semiconductor die 12, the proximal ends of the leads, the wire bonds 20, and portions of the mounting surface 14 are encapsulated by an encapsulating material 22. The encapsulating material 22 is a thermosetting plastic, for example a phenolic epoxy, an epoxy novolac resin, or other molding compound resin. The encapsulating material 22 should have a low coefficient of thermal expansion substantially in a range of 10 to 60 ppm/°C. below its glass transition temperature. The advantage to having the encapsulating material 22 is that it protects the wire bonds and keeps them rigidly fixed in place during subsequent transfer molding.

Additionally, FIG. 1 illustrates the semiconductor die 12, portions of the leads, the wire bonds 20, portions of the mounting surface 14, and the encapsulant 22 to be further encapsulated by a package body 24. Package body 24 is typically made of a molded plastic material, for example a phenolic epoxy, an epoxy novolac resin, or other molding compound resin. Encapsulant 22 and package body 24 should have similar thermal expansion coefficients to avoid thermal mismatch. Distal ends of leads 18 extend out of package body 24 and are formed into a gull wing configuration. The distal ends of the leads may also be formed into other lead configurations, such as J-lead or a through-hole configuration.

Figure 2:
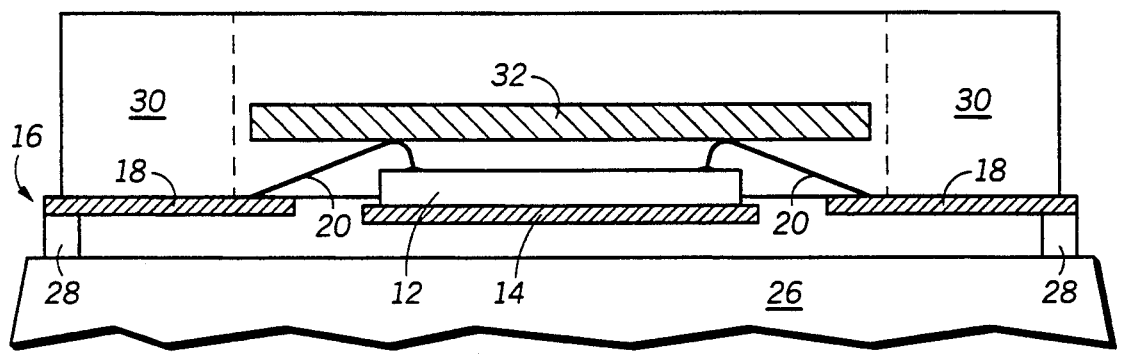
FIG. 2 is a cross-sectional view of a thin pellet of compound placed above a wire bonded leadframe which illustrates a method of applying a first encapsulant, in accordance with the present invention.

Also in accordance with the present invention is a method for molding a wire-bonded leadframe without affecting the position of the wires and their bonds. As illustrated in FIG. 2, the semiconductor die 12, the proximal ends of the leads, the wire bonds 20 and portions of the mounting surface 14 are elevated above a heated surface 26, supported by metal spacers 28. The height of the metal spacers 24 should be substantially in the range of 0.25 to 0.40 mm. Metal clamping ring 30 holds leadframe 16 (not entirely shown) in place. An encapsulating compound pellet 32 is placed above the semiconductor die 12 and the wires bonds 20, where the weight of the compound pellet 32 is distributed over the wire bonds 20. The volume of the compound pellet 32 is pre-calculated for the specific semiconductor die 12, the wire bonds 20 and the leadframe 16 being encapsulated. The compound pellet 32 is applied, without external force, onto the unit via heat transfer through metal spacers 28, the plurality of leads 18 and metal clamping ring 30, with the heat source being the hot plate 26.

Figure 3:
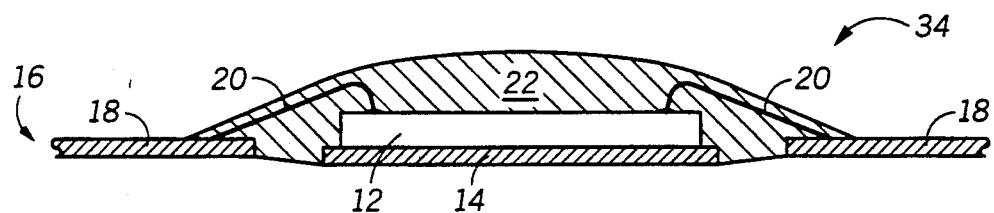
FIG. 3 is a cross-sectional view of a semiconductor device illustrating an embodiment of the present invention.

Illustrated in FIG. 3 is an encapsulated pre-finished semiconductor device 34, an embodiment of the present invention. The semiconductor die 12, the plurality of wire bonds 20 and a portion of the plurality of leads 18 are fully encapsulated with the encapsulant 22. The encapsulating material 22 is confined to the top side of the leadframe 16 due to surface tension and the viscosity of the compound during the melt. Furthermore, the air gap between the bottom of the leadframe 16 and the hot plate 26, as shown previously in FIG. 2, allows the melted compound to cool and gel before it can drip to the bottom surface of the leadframe 16. It should also be noted that the gap between the mounting surface 14 and the proximal ends of the plurality of leads 18 should be narrow enough so that the surface tension of the compound is sufficient to keep it from overflowing through the gap. This gap can be substantially in the range of 0.3 mm to 1.9 mm. Other gaps may also be effective but it is desirable to avoid having the compound drip through the gap.

The encapsulated pre-finished semiconductor device 34 should remain on the hot plate 26 for a sufficient time for the encapsulating material 22 to cure to an acceptable hardness. Five minutes of curing on the hot plate was sufficient to eliminate the wire sweep problem in subsequent molding of semiconductor device 34. Semiconductor device 34, however, may also be post-cured in an oven for an extended period of time to complete the cross-linking of the encapsulant 22, but this step is not necessary to solve the wire sweep problem in transfer molding.

During a conventional transfer molding process of a plastic semiconductor package, a leadframe with a semiconductor die attached and electrically coupled thereto is placed on one of two mold tool platens. The two platens are then brought together to form a cavity around the die and proximal ends of the leads. An encapsulating material is introduced into the cavity, thereby forming a package body.

Figure 4:
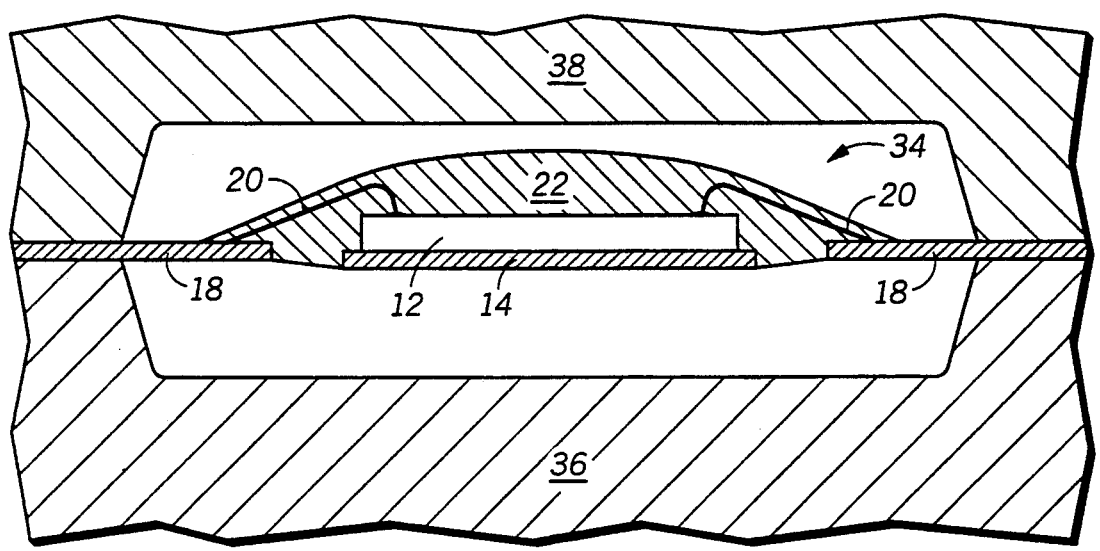
FIG. 4 is a cross-sectional view of a mold tool which illustrates a method of forming a semiconductor device, in accordance with the present invention.

With the present invention, as illustrated in FIG. 4, the pre-encapsulated semiconductor device 34 is placed onto a mold tool platen 36. The second mold tool platen 38 is brought together with the first mold tool platen 36 to form a cavity around the semiconductor die 12, the first encapsulant 22 and proximal ends of the leads. A second encapsulating material can then be introduced into the cavity thereby forming a package body. In the semiconductor device's final form, distal ends of leads 18 that extend out of the package body can be formed into a gull wing configuration. The distal ends of the leads may also be formed into other lead configurations, such as J-lead or a through-hole configuration.

The foregoing description and illustrations contained herein demonstrate many of the advantages associated with the present invention. In particular, it has been revealed that the actual transfer molding process does not change by utilizing the invention. The key difference is that the final molded unit consists of two different encapsulants of similar material properties. Moreover, the first encapsulant has been applied without external force or pressure, so it does not sweep the wires during the encapsulating process. Once the first encapsulant has cured, however, it does confine the wire bonds to their fixed position, thereby enabling the second encapsulant to be introduced into the mold die cavity without causing any wire sweep. Yet another advantage to the present invention is that no mold die cavity modification of any existing molding equipment is required, which translates into an added cost advantage to implementing the invention.

Thus it is apparent that there has been provided, in accordance with the invention, a plastic molded semiconductor device with minimal wire sweep and a method for forming the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, use of the invention is not limited to use in conjunction with semiconductor devices having only one semiconductor die but may also include multiple die devices. The invention is not limited to using the materials mentioned for the various elements of the invention, but may include use of any material which meets the needs of that particular element. In addition, the invention is not limited to using the first encapsulant configuration illustrated or described. Any shape or configuration of the first encapsulant that serves the purpose of that element is included. It is also important to note that the present invention is not limited in any way to only plastic packages that are formed through transfer molding. Other molding techniques, such as injection molding, which serves the same purpose of forming a package body may be used. Therefore, it is intended that this invention encompass all such variations and modifications as fall within the scope of the appended claims.

I claim:

1. A semiconductor device comprising:
   a leadframe with a die receiving area and a plurality of leads;

a semiconductor die attached to the die receiving area, the semiconductor die having a plurality of bonding pads on a surface;

a conductive wire extending from each bonding pad to one of the plurality of leads, the conductive wire electrically coupling the semiconductor die to the leadframe;

an epoxy resin encapsulating compound formed over the surface of the die including the pads and a portion of the leadframe, wherein the epoxy resin encapsulating compound completely encapsulates each of the conductive wires and only covers a first side of the leadframe, the epoxy resin encapsulating compound comprising a material having a low coefficient of thermal expansion; and a second encapsulating compound surrounding the die, the epoxy resin encapsulating compound, a second side of the leadframe, and a portion of the leads.

2. The semiconductor device according to claim 1 wherein the epoxy resin encapsulating compound has a thermal expansion coefficient substantially in a range of 10 to 60 ppm/°C. at a temperature below a glass transition temperature of the epoxy resin encapsulating compound.

3. The semiconductor device according to claim 1 wherein the second encapsulating compound is an epoxy resin based molding compound.

4. The semiconductor device according to claim 1 wherein the epoxy resin encapsulating compound has a thickness substantially in a range of 0.1 mm to 1.5 mm.

5. The semiconductor device according to claim 1 wherein the epoxy resin encapsulating compound has a viscosity lower than that of the second encapsulating compound.

6. The semiconductor device according to claim 1, wherein the die receiving area and proximal ends of the plurality of leads are separated by a gap substantially in a range of 0.3 to 1.9 millimeters.

7. A semiconductor device comprising:

a leadframe with a die receiving area and a plurality of leads;

a semiconductor die attached to the die receiving area, the semiconductor die having a plurality of bonding pads on a surface;

a conductive wire extending from each bonding pad to one of the plurality of leads, the conductive wire electrically coupling the semiconductor die to the leadframe;

an epoxy resin encapsulating compound formed over the surface of the die including the pads and a portion of the leadframe, wherein the epoxy resin encapsulating compound completely encapsulates each of the conductive wires and only covers a first side of the leadframe, the epoxy resin encapsulating compound having a coefficient of thermal expansion and a flexural modulus; and a second encapsulating compound surrounding the die, the epoxy resin encapsulating compound, a second side of the leadframe, and a portion of the leads, the second encapsulating compound having a coefficient of thermal expansion and a flexural modulus substantially equal to the coefficient of thermal expansion and flexural modulus of the epoxy resin encapsulating compound.

8. The semiconductor device according to claim 7 wherein the second encapsulating compound is an epoxy resin based molding compound.

9. The semiconductor device according to claim 7 wherein the epoxy resin encapsulating compound has a thickness substantially in a range of 0.1 mm to 1.5 mm.

10. The semiconductor device according to claim 7 wherein the epoxy resin encapsulating compound has a viscosity lower than that of the second encapsulating compound.

11. The semiconductor device according to claim 7, wherein the die receiving area and proximal ends of the plurality of leads are separated by a gap substantially in a range of 0.3 to 1.9 millimeters.

* * * * *